United States Patent
Seong et al.

(10) Patent No.: US 11,290,137 B1
(45) Date of Patent: Mar. 29, 2022

(54) SPLITTER CIRCUIT, FRONT END MODULE, AND OPERATING METHOD THEREOF

(71) Applicant: Samsung Electro-Mechanics Co., Ltd., Suwon-si (KR)

(72) Inventors: Nackgyun Seong, Suwon-si (KR); Juyoung Park, Suwon-si (KR); Hyungoo Jeon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/115,024

(22) Filed: Dec. 8, 2020

(30) Foreign Application Priority Data

Sep. 8, 2020 (KR) .................. 10-2020-0114645

(51) Int. Cl.
| | | |
|---|---|---|
| *H04B 1/10* | (2006.01) | |
| *H04B 1/16* | (2006.01) | |
| *H03F 1/22* | (2006.01) | |
| *H03F 3/19* | (2006.01) | |
| *H04B 1/04* | (2006.01) | |
| *H03F 1/52* | (2006.01) | |
| *H03F 1/30* | (2006.01) | |
| *H03F 1/10* | (2006.01) | |

(52) U.S. Cl.
CPC .................. *H04B 1/04* (2013.01); *H03F 1/10* (2013.01); *H03F 1/30* (2013.01); *H03F 1/52* (2013.01)

(58) Field of Classification Search
None
See application file for complete search history.

(56) References Cited

U.S. PATENT DOCUMENTS

| | | | | |
|---|---|---|---|---|
| 6,812,786 | B2* | 11/2004 | Jackson | H03F 1/52 330/124 D |
| 8,130,874 | B2* | 3/2012 | Niemi | H03F 1/52 375/328 |
| 8,213,878 | B1 | 7/2012 | Robbins et al. | |
| 8,706,065 | B2 | 4/2014 | Tran et al. | |
| 9,985,586 | B2* | 5/2018 | Kim | H03F 1/303 |
| 10,772,052 | B2* | 9/2020 | O'Shea | H04W 72/1215 |
| 2010/0026388 | A1* | 2/2010 | Plotka | H03F 3/602 330/124 R |
| 2013/0241666 | A1* | 9/2013 | Granger-Jones | H01P 1/15 333/101 |
| 2015/0054587 | A1* | 2/2015 | Yoshizaki | H03F 3/72 330/296 |
| 2016/0191092 | A1* | 6/2016 | Liao | H04B 1/1036 455/307 |
| 2020/0076565 | A1 | 3/2020 | Lan et al. | |

* cited by examiner

*Primary Examiner* — Pablo N Tran
(74) *Attorney, Agent, or Firm* — NSIP Law

(57) ABSTRACT

A splitter circuit includes: a signal divider configured to split and transmit a first radio frequency (RF) signal received in a first receiving mode in which a first communication scheme and a second communication scheme are simultaneously performed; a first bypass circuit configured to bypass the signal divider to transmit a second RF signal received in a second receiving mode in which the first communication scheme is performed; and a second bypass circuit configured to bypass the signal divider to transmit a third RF signal received in a third receiving mode in which the second communication scheme is performed.

20 Claims, 10 Drawing Sheets

SPLITTER CIRCUIT, FRONT END MODULE, AND OPERATING METHOD THEREOF

CROSS-REFERENCE TO RELATED APPLICATIONS

This application claims the benefit under 35 U.S.C. § 119(a) of Korean Patent Application No. 10-2020-0114645 filed on Sep. 8, 2020 in the Korean Intellectual Property Office, the entire disclosure of which are incorporated herein by reference for all purposes.

BACKGROUND

1. Field

The following description relates to a splitter circuit, a front end module, and an operating method of a splitter circuit and a front end module.

2. Description of Related Art

In wireless local area network (WLAN) technology, technology development and standardization with a wider bandwidth and a high throughput rate is being conducted to improve communication speed. Recently, technology and standardization that not only improve communication speed, but also provide further improved communication performance in an environment in which access points (APs) and terminals are concentrated, is being conducted. For example, standardization of the next generation standard WiFi 6 (802.11ax) to which technologies such as OFDMA and multi-user MIMO (MU-MIMO) for a high-density/high-efficiency WLAN are applied is being conducted. In 2018, the U.S. federal communications commission (FCC) additionally allocated a 6 GHz band (5.925 to 7.125 GHz) as an unlicensed band, and accordingly, a 1200 MHz bandwidth is secured to allow various WiFi 6 services to be provided.

Meanwhile, the 5G mobile communication service is commercially available, and the licensed assisted access (LTE-LAA) carrier aggregation (CA) technology for smoothly implementing the 5G mobile communication service has been proposed. The LTE-LAA CA technology is a technology that transmits data using a wider band by combining the LTE licensed band and the unlicensed band including the WiFi frequency, and may provide a transmission speed that is about 10 times faster than that of the existing LTE technology.

Due to advancement of these technologies, the LTE-LAA and WiFi wireless environment coexist, and thus a front end module (FEM) that supports a co-existence operation in a transmitter and a receiver of a mobile device that supports LTE-LAA and WiFi is required. That is, the LTE-LAA's unlicensed band and the unlicensed WiFi band may overlap each other, and the mobile device that simultaneously supports LTE-LAA and WiFi unlicensed bands requires a front end module (FEM) that may perform a co-existence operation and cover the 6 GHz band. In addition, for the co-existence operation, the front end module includes a splitter (or divider) that splits a received signal.

The above information disclosed in this Background section is only for enhancement of understanding of the background of the disclosure, and therefore it may contain information that does not form the prior art that is already known.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a splitter circuit includes: a signal divider configured to split and transmit a first radio frequency (RF) signal received in a first receiving mode in which a first communication scheme and a second communication scheme are simultaneously performed; a first bypass circuit configured to bypass the signal divider to transmit a second RF signal received in a second receiving mode in which the first communication scheme is performed; and a second bypass circuit configured to bypass the signal divider to transmit a third RF signal received in a third receiving mode in which the second communication scheme is performed.

The first bypass circuit may include a first switch configured to be turned on in the second receiving mode. The second bypass circuit may include a second switch configured to be turned on in the third receiving mode.

The signal divider may include a third switch configured to be turned on in the first receiving mode.

The first switch may be connected to an input terminal to which the second RF signal is input. The first bypass circuit may further include a third switch connected to an output terminal of the first bypass circuit and configured to be turned on in the second receiving mode. The second switch may be connected to the input terminal. The second bypass circuit may further include a fourth switch connected to an output terminal of the second bypass circuit and configured to be turned on in the third receiving mode.

The first bypass circuit may be connected between the first switch and the third switch and may further include a matching circuit configured to perform impedance matching. The second bypass circuit may be connected between the second switch and the fourth switch, and may further include another matching circuit configured to perform impedance matching.

The signal divider may be configured to split the first RF signal into a first spilt signal and a second split signal in the first receiving mode, output the first split signal to a first output terminal, and output the second split signal to a second output terminal. The third switch may be connected to an input terminal to which the first RF signal is input. The signal divider may further include a fourth switch connected to the first output terminal and configured to be turned on in the first receiving mode, and a fifth switch connected to the second output terminal and configured to be turned on in the first receiving mode.

The signal divider may further include a first impedance element connected between the third switch and the fourth switch, and a second impedance element connected between the fourth switch and the fifth switch.

The third switch may include a sixth switch that is connected to the input terminal and is turned on in the first receiving mode, and a seventh switch that is connected to the input terminal and is turned on in the first receiving mode.

The splitter circuit may include an input terminal to which the first, second, and third RF signals are input, a first output terminal, and a second output terminal. The signal divider may be configured to split the first RF signal into a first spilt signal and a second split signal, output the first split signal to the first output terminal, and output the second split signal to the second output terminal. The first bypass circuit may be configured to transmit the second RF signal to the first output terminal. The second bypass circuit may be configured to transmit the third RF signal to the second output terminal.

A signal output from the first output terminal may be transmitted to a first communication chipset configured to perform the first communication scheme. A signal output from the second output terminal may be transmitted to a second communication chipset configured to perform the second communication scheme.

In another general aspect, a front end module includes: a first switch configured to switch a received radio frequency (RF) signal input from an antenna; an amplifier configured to amplify the received RF signal; and a splitter circuit configured to split and transmit a first signal output from the amplifier. The splitter circuit includes: a first bypass circuit configured to not split the first signal in a first receiving mode in which a first communication scheme is performed and transmit the first signal to a first output terminal, and a second bypass circuit configured to not split the first signal in a second receiving mode in which a second communication scheme is performed and transmit the first signal to a second output terminal.

The splitter circuit may further include a signal divider configured to, in a third receiving mode in which the first communication scheme and the second communication scheme are simultaneously performed, split the first signal into a first split signal and a second split signal, output the first split signal to the first output terminal, and output the second split signal to the second output terminal.

The first bypass circuit may include a second switch configured to be turned on in the first receiving mode. The second bypass circuit may include a third switch configured to be turned on in the second receiving mode. The splitter circuit may further include a fourth switch configured to be turned on in the third receiving mode.

The second, third, and fourth switches may be connected to an input terminal to which the first signal is input. The first bypass circuit may further include a fifth switch connected between the second switch and the first output terminal. The second bypass circuit may further include a sixth switch connected between the third switch and the second output terminal. The splitter circuit may further include a seventh switch connected between the fourth switch and the first output terminal, and an eighth switch connected between the fourth switch and the second output terminal.

The first bypass circuit may further include a matching circuit connected between the second switch and the fifth switch. The second bypass circuit may further include a matching circuit connected between the third switch and the sixth switch.

A signal output from the first output terminal may be transmitted to a first communication chipset configured to perform the first communication scheme. A signal output from the second output terminal may be transmitted to a second communication chipset configured to perform the second communication scheme.

The first switch, the amplifier, and the splitter circuit may be included in one IC.

In another general aspect, an operating method of a splitter circuit configured to split a received RF signal includes: splitting the received RF signal into a first split signal and a second split signal in a first receiving mode in which a first communication scheme and a second communication scheme are simultaneously performed; providing a first path that does not split the received RF signal in a second receiving mode in which only the first communication scheme is performed and bypasses the received RF signal; and providing a second path that does not split the received RF signal in a third receiving mode in which only the second communication scheme is performed and bypasses the received RF signal.

The first path may include a first switch that is turned on in the second receiving mode. The second path may include a second switch that is turned on in the third receiving mode.

The first split signal may be transmitted to a first communication chipset that performs the first communication scheme. The second split signal may be transmitted to a second communication chipset that performs the second communication scheme. A signal output through the first path may be transmitted to the first communication chipset. A signal output through the second path may be transmitted to the second communication chipset.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
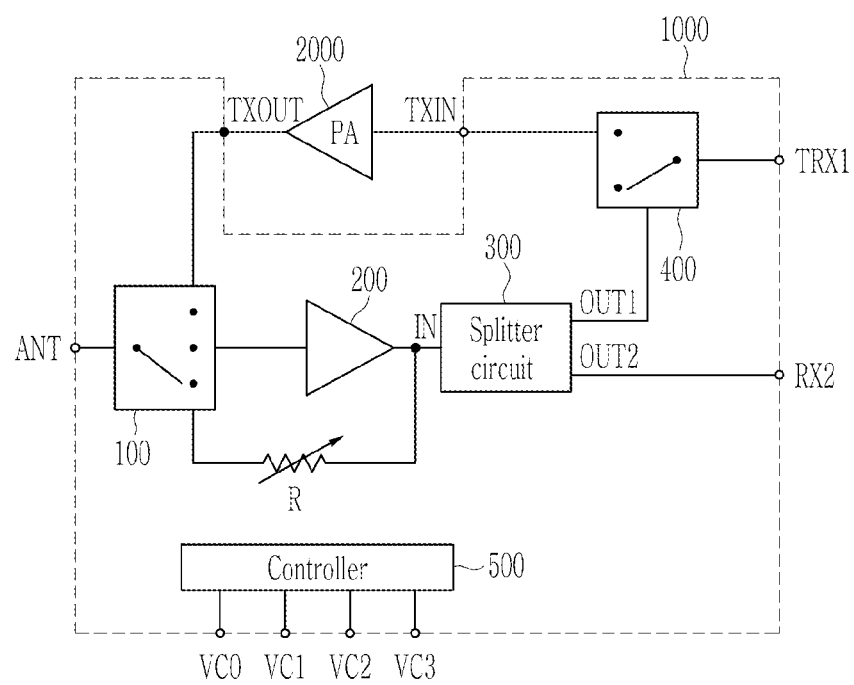
FIG. 1 illustrates a schematic view of a front end module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Throughout the specification, an RF signal may include any protocol among Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, and 5G protocols, and any other wireless and wired protocols designated thereafter, but is not limited thereto.

FIG. 1 illustrates a schematic view of a front end module 1000, according to an embodiment.

The front end module 1000 may include a transmitting/receiving port TRX1, a receiving port RX2, and an antenna port ANT.

The transmitting/receiving port TRX1 receives a radio frequency (RF) transmitting signal in a transmitting mode, and outputs the received RF signal in a receiving mode. In addition, the receiving port RX2 outputs the received RF signal in the receiving mode. The received RF signal output from the transmitting/receiving port TRX1 may be input to a first communication chipset performing a first communication scheme, and the received RF signal output from the receiving port RX2 may be input to a second communication chipset performing a second communication scheme. The first communication scheme and the second communication scheme may be communication schemes based on different respective standards. As an example, the first communication scheme may be a WiFi communication standard, and the second communication scheme may be a cellular communication standard. The second communication scheme may be an LTE-LAA method based on a cellular communication standard. That is, the front end module 1000 may support a co-existence operation.

The antenna port ANT of the front end module 1000 is connected to an antenna, outputs the transmitted RF signal to the antenna, and receives the received RF signal from the antenna.

The front end module 1000 may further include a transmitting input port TXIN configured to output a transmitted RF signal to a power amplifier 2000 and a transmitting output port TXOUT configured to receive an output signal of the power amplifier 2000. Since the power amplifier 2000 consumes the most power among elements included in a transmitter and receiver, the power amplifier 2000 may be implemented as a module separate from the front end module 1000.

As shown in FIG. 1, the front end module 1000 may include, for example, a switch 100, an amplifier 200, a splitter circuit 300, a switch 400, and a controller 500.

The switch 100 selectively switches the transmitted RF signal and the received RF signal. The switch 100 is connected between the antenna port ANT, the transmitting output port TXOUT, the amplifier 200, and a variable resistor R, and performs a switching operation according to the transmitting mode and the receiving mode. In the transmitting mode, the switch 100 switches the transmitted RF signal input from the transmitting output port TXOUT to the antenna port ANT. In addition, in the receiving mode, the switch 100 switches the received RF signal input from the antenna port ANT to the amplifier 200 or the variable resistor R. To support the switching, the switch 100 may be implemented as a single pole three throw (SP3T) switch.

The amplifier 200 amplifies the received RF signal input from the switch 100, and outputs the amplified received RF signal to the splitter 300. Since the received RF signal may be weak, the amplifier 200 may amplify the received RF signal. The amplifier 200 may be implemented as a low noise amplifier (LNA), for example.

The variable resistor R is connected between the switch 100 and an output terminal of the amplifier 200, and attenuates the received RF signal input from the switch 100. A resistance value of the variable resistor R may be varied, depending on strength of the received RF signal. When an amplitude of the received RF signal is a large, the variable resistor R attenuates the received RF signal. When an amplitude of the received RF signal is small, the switch 100 switches the received RF signal to the amplifier 200. In addition, when the amplitude of the received RF signal is large, the switch 100 switches the received RF signal to the variable resistor R.

The splitter circuit 300 functions to split and transmit the received RF signal input from the amplifier 200 or the variable resistor R. The splitter circuit 300 may include, for example, a plurality of switches, and may selectively split the received RF signal according to a type of the receiving mode by a switching operation of the plurality of switches. The type of the receiving mode may include three modes, for example. That is, the receiving mode may include a first receiving mode, a second receiving mode, and a third receiving mode.

The first receiving mode may be a mode in which only a first communication scheme is performed. That is, the first receiving mode is a mode in which the received RF signal is received by the first communication scheme and the received RF signal is not received by a second communication scheme. In other words, the first receiving mode is a mode in which only a first communication chipset (for example, a WiFi chipset) operates and a second communication chipset (for example, a cellular chipset) does not operate. In the first receiving mode, the splitter circuit 300 may directly transmit the received RF signal to the transmitting/receiving port TRX1 through a first bypass circuit (310 of FIG. 3) without splitting the received RF signal into two signals.

The second receiving mode is a mode in which only the second communication scheme is performed. That is, the second receiving mode is a mode in which the received RF signal is received by the second communication scheme and the received RF signal is not received by the first communication scheme. In other words, the second receiving mode is a mode in which only the second communication chipset (for example, a cellular chipset) operates and the first communication chipset (for example, a WiFi chipset) does not operate. In the second receiving mode, the splitter circuit 300 may directly transmit the received RF signal to the receiving port RX2 through a second bypass circuit (330 of FIG. 3) without splitting the received RF signal into two signals.

In addition, the third receiving mode is a mode in which the first communication scheme and the second communication scheme are simultaneously performed. That is, the third receiving mode is a mode in which the received RF signal is received by the first communication scheme, and simultaneously, the received RF signal is received by the second communication scheme. In other words, the third receiving mode is a mode in which the first communication chipset (for example, a WiFi chipset) operates, and simultaneously, the second communication chipset (for example, a cellular chipset) operates. In the third receiving mode, the splitter circuit 300 splits the received RF signal into two signals ("split signals") through a signal divider (320 in FIG. 3), and transmits the split signals to the transmitting/receiving port TRX1 and the receiving port RX2, respectively.

A more detailed configuration and operation of the splitter circuit 300 performing such a signal splitting operation will be described in detail with reference to FIG. 3, FIG. 4, and FIG. 5A to FIG. 5C.

The switch 400 selectively switches the transmitted RF signal and the received RF signal. The switch 400 is connected between the transmitting/receiving port TRX1, the transmitting input port TXIN, and a first output terminal OUT1 of the splitter circuit 300, and may perform a switching operation according to the transmitting mode and the receiving mode. In the transmitting mode, the switch 400 switches the transmitted RF signal input from the transmitting/receiving port TRX1 to the transmitting input port TXIN (that is, the input terminal of the power amplifier 2000). In addition, in the receiving mode, the switch 400 switches the received RF signal input from the first output terminal OUT1 of the splitter circuit 300 to the transmitting/receiving port TRX1. To support the switching operation, the switch 400 may be implemented as a single pole double throw (SPDT) switch.

The controller 500 may receive a mode control voltage from an external component or device (for example, a communication chipset) and, according to the mode control voltage, the controller 500 may control the switch 100, a switch included in the splitter circuit 300, the switch 400, and the variable resistor R. The mode control voltage may be one of mode control voltages VC0, VC1, VC2, and VC3, and the mode control voltages VC0, VC1, VC2, and VC3 may be set to have a different value according to types of transmitting mode and receiving mode.

When the mode control voltage corresponding to the transmitting mode is input, the controller 500 may control the switch 100 and the switch 400 so that a transmitting mode operation is performed. When the mode control voltage corresponding to the receiving mode is input, the controller 500 may control the switch 100 and the switch 400 so that a receiving mode operation is performed. In addition, when a mode control voltage corresponding to the type of receiving mode (that is, one of the first to third receiving modes) is input, the controller 500 may control a switch included in the splitter circuit 300. A method of controlling the switch included in the splitter circuit 300 according to the type of receiving mode will be described in more detail with reference to FIG. 4 and FIG. 5A to FIG. 5C. The controller 500 may control a resistance value of the variable resistor R according to an amplitude of the received RF signal.

The switch 100, the switch 400, and the switch included in the splitter circuit 300 may each include a transistor, and the controller 500 may output a control voltage input to a control terminal (for example, a gate terminal and a base terminal) of the transistor. When the control voltage is a turn-on voltage, the corresponding transistor may be turned on, and when the control voltage is a turn-off voltage, the corresponding transistor may be turned off.

Figure 2:
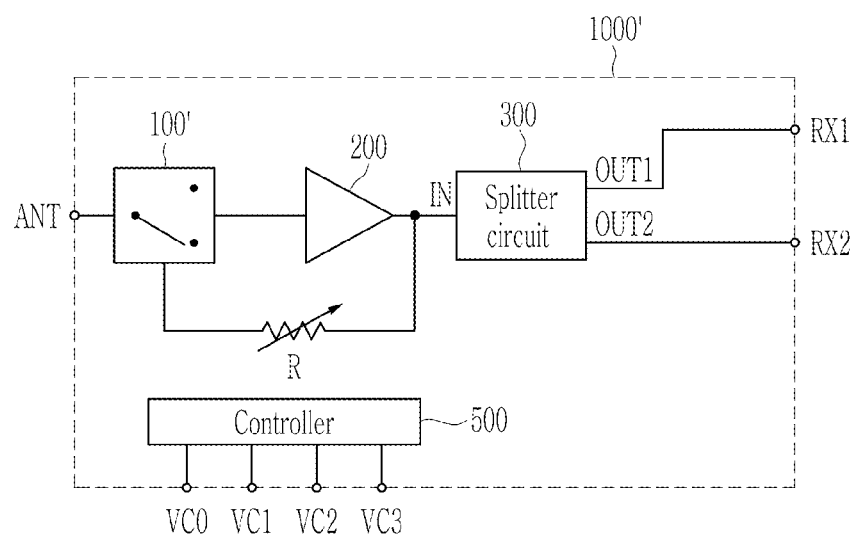
FIG. 2 illustrates a schematic view of a front end module, according to an embodiment.

FIG. 2 illustrates a schematic view of a front end module 1000', according to an embodiment.

As shown in FIG. 2, the front end module 1000' has a structure in which the transmitting element is omitted from the front end module 1000 of FIG. 1. That is, in the front end module 1000', the switch 400 is omitted from the front end module 1000 of FIG. 1, and the switch 100 is replaced by a switch 100'. In addition, the transmitting/receiving port TRX1 is replaced by the receiving port RX1. The switch 100' switches the received RF signal input from the antenna port ANT to the amplifier 200 or the variable resistor R. To support the switching operation, the switch 100 may be implemented as a single pole double throw (SPDT) switch.

The front end module 1000 of FIG. 1 and the front end module 1000' of FIG. 2 may each be implemented as one IC. That is, the switches 100 and 400, the amplifier 200, and the splitter circuit 300 may be implemented together with one IC. In addition, since the splitter circuit 300 includes a plurality of switches, the received RF signal may be selectively output to the transmitting/receiving port TRX1 or the receiving port RX2.

Hereinafter, a more detailed configuration and operating method of the splitter circuit 300 will be described.

Figure 3:
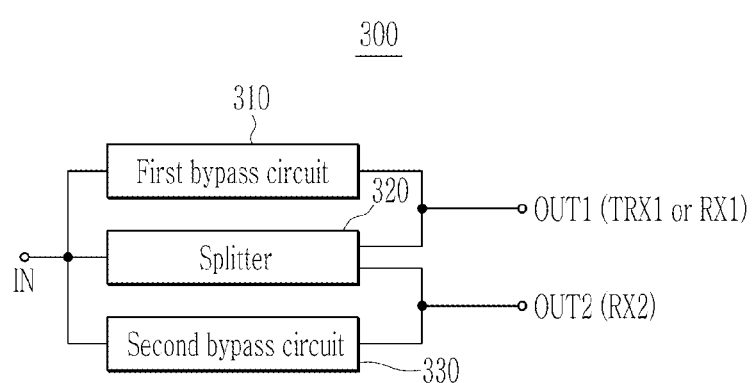
FIG. 3 illustrates a schematic view of a splitter circuit, according to an embodiment.

FIG. 3 illustrates a schematic view of the splitter circuit 300, according to an embodiment.

As shown in FIG. 3, the splitter circuit 300 may include, for example, a first bypass circuit 310, a second bypass circuit 330, and a signal divider 320.

An input terminal IN of the splitter circuit 300 receives the RF signal from the amplifier 200 or the variable resistor R. In addition, the splitter circuit 300 may include two output terminals OUT1 and OUT2. The first output terminal OUT1 may correspond to the transmitting/receiving port TRX1 of FIG. 1 or the receiving port RX1 of FIG. 2, and the second output terminal OUT2 may correspond to the receiving port RX2 of FIG. 1 and FIG. 2.

The first bypass circuit 310 allows the received RF signal input from the input terminal IN in the first receiving mode, to bypass the signal divider 320 to be transmitted to the first output terminal OUT1. That is, the first bypass circuit 310 does not split the RF signal received in the first receiving mode in which only the first communication scheme is performed, and bypasses the received RF signal. As described above, by bypassing the received RF signal, unnecessary performance degradation due to signal splitting may be minimized. When the RF signal received in the first receiving mode is split without bypassing, loss due to signal splitting may occur. However, such unnecessary signal loss may be prevented through bypassing by the first bypass circuit 310.

The second bypass circuit 330 allows the received RF signal input from the input terminal IN in the second receiving mode to bypass the signal divider 320 to be transmitted to the second output terminal OUT2. That is, the second bypass circuit 330 does not split the RF signal received in the second receiving mode in which only the second communication scheme is performed, and bypasses the received RF signal. As described above, by bypassing the received RF signal, unnecessary performance degradation due to signal splitting may be minimized. When the RF signal received in the second receiving mode is split without bypassing, loss due to signal splitting may occur. However, such unnecessary signal loss may be prevented through bypassing by the second bypass circuit 330.

In addition, the signal divider 320 splits the received RF signal input to the input terminal IN in the third receiving mode into two signals, and outputs the split signals to the first output terminal OUT1 and the second output terminal OUT2, respectively. That is, the signal divider 320 splits the RF signal received in the third receiving mode, in which the first communication method and the second communication are simultaneously performed, into a first split signal and a second split signal. The signal divider 320 outputs the first split signal to the first output terminal OUT1 and outputs the second split signal to the second output terminal OUT2.

As described above, the splitter circuit 300 bypasses the received RF signal without passing through the signal divider 320 when the first communication scheme and the second communication scheme separately operate (that is, in the first receiving mode or the second receiving mode). Through these bypassing operations, unnecessary performance deterioration due to the signal divider 320 may be minimized. That is, the splitter circuit 300 may reduce loss due to the signal divider 320 by additionally providing the first and second bypass circuits 310 and 330, which are bypass paths, to the signal divider 320.

Figure 4:
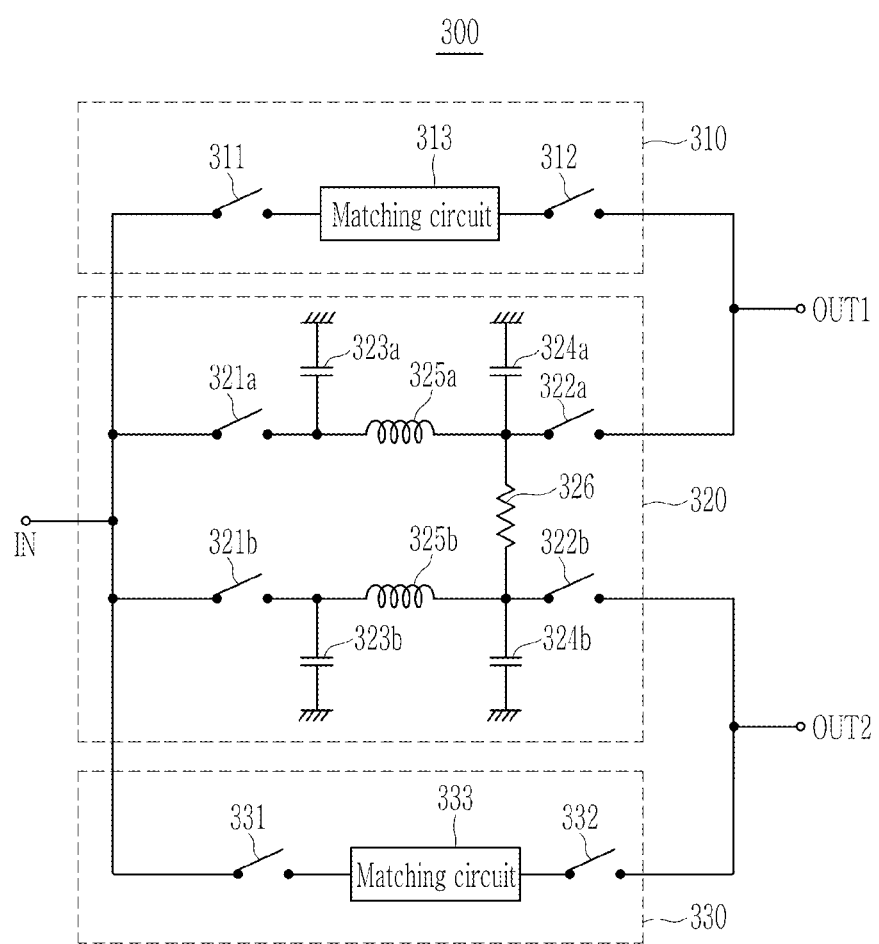
FIG. 4 illustrates a configuration of a splitter circuit, according to an embodiment.

FIG. 4 illustrates a configuration of the splitter circuit 300, according to the embodiment.

Referring to FIG. 4, the first bypass circuit 310 may include a switch 311, a switch 312, and a matching circuit 313. The switch 311 is connected between the input terminal IN and the matching circuit 313. The switch 312 is connected between the matching circuit 313 and the first output terminal OUT1. The matching circuit 313 is connected between the switch 311 and the switch 312. The matching circuit 313 performs impedance matching between the input terminal IN and the first output terminal OUT1. The matching circuit 313 may be realized with an impedance element (for example, an inductor) for impedance matching. When the first bypass circuit 310 does not operate (that is, when the switches 311 and 312 are turned off), the switch 312 may serve as an isolation switch that prevents a signal from being introduced to the first bypass circuit 310. The switch 311 and the switch 312 may be turned on in the first receiving mode to bypass the received RF signal.

The second bypass circuit 330 may include a switch 331, a switch 332, and a matching circuit 333. The switch 331 may be connected between the input terminal IN and the matching circuit 333. The switch 332 may be connected between the matching circuit 333 and the first output terminal OUT2. The matching circuit 333 is connected between the switch 331 and the switch 332. The matching circuit 333 performs impedance matching between the input terminal IN and the second output terminal OUT2. The matching circuit 333 may be realized with an impedance element (for example, an inductor) for impedance matching. When the second bypass circuit 330 does not operate (that is, when the switches 331 and 332 are turned off), the switch 332 may serve as an isolation switch that prevents a signal from being introduced to the second bypass circuit 330. The switch 331 and the switch 332 may be turned on in the second receiving mode to bypass the received RF signal.

In addition, the signal divider 320 may include switches 321a and 322a, capacitors 323a and 324a, an inductor 325a, switches 321b and 322b, capacitors 323b and 324b, an inductor 325b, and a resistor 326.

One terminal of the switch 321a may be connected to the input terminal IN, and the capacitor 323a may be connected between the other terminal of the switch 321a and the ground. One terminal of the inductor 325a may be connected to the other terminal of the switch 321a, and the capacitor 324a may be connected between the other terminal of the inductor 325a and the ground. In addition, the switch 322a may be connected between the other terminal of the inductor 325a and the first output terminal OUT1.

One terminal of the switch 321b may be connected to the input terminal IN, and the capacitor 323b may be connected between the other terminal of the switch 321b and the ground. One terminal of the inductor 325b may be connected to the other terminal of the switch 321b, and the capacitor 324b may be connected between the other terminal of the inductor 325b and the ground. In addition, the switch 322b may be connected between the other terminal of the inductor 325b and the second output terminal OUT2. The resistor 326 may be connected between the other terminal of the inductor 325a and the other terminal of the inductor 325b.

In the third receiving mode, the switches 321a and 322a and the switches 321b and 322b are turned on. The switch 322a and the switch 322b may serve as isolation switches that prevent a signal from being introduced to the signal divider 320 when the signal divider 320 does not operate.

In the third receiving mode, the capacitors 323a and 324a, the inductor 325a, and the resistor 326 provide a predetermined first impedance value between the input terminal IN and the first output terminal OUT1. In addition, in the third receiving mode, the capacitors 323b and 324b, the inductor 325b, and the resistor 326 provide a predetermined second impedance value between the input terminal IN and the second output terminal OUT2. An RF signal received in the third receiving mode may be split into two signals by the first impedance value and the second impedance value. In FIG. 4, the elements for providing the first impedance value (the capacitor 323a, the inductor 325a, and the capacitor 324a) and the elements for providing the second impedance value (the capacitor 323b, the inductor 325b, and the capacitor 324b) are each shown to have a pi (π) structure, but they may have different structures. In addition, the elements for providing the first impedance value (the capacitor 323a, the inductor 325a, and the capacitor 324a) and the elements for providing the second impedance value (the capacitor 323b, the inductor 325b, and the capacitor 324b) are shown to have structures that are symmetrical to each other for convenience of design, but they may have an asymmetrical structure.

Capacitance of the capacitors 323a, 324a, 323b, and 324b and inductance of the inductors 325a and 325b may provide a resonant frequency to the signal divider 320, and the signal divider 320 may have a wider bandwidth based on the provided resonance frequency. For example, the capacitors 323a, 324a, 323b, and 324b and the inductors 325a and 325b may have an impedance value so that an RF signal of a fundamental frequency included in 5.1 GHz to 7.2 GHz bands is transmitted to the output terminals OUT1 and OUT2. Accordingly, the signal divider 320 may have a wide bandwidth stably covering a frequency band corresponding to the first communication scheme (for example, WiFi) and a frequency band corresponding to the second communication scheme (for example, LTE-LAA).

Figure 5A:
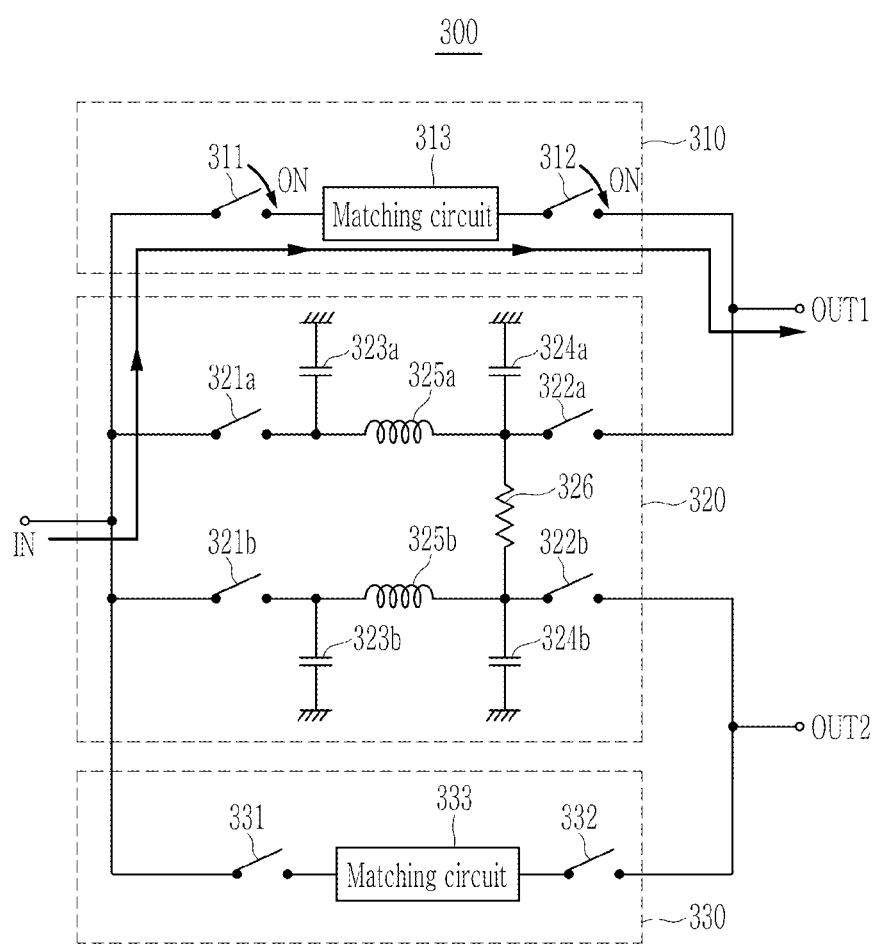
FIG. 5A to FIG. 5C respectively illustrate an operating method of the splitter circuit of FIG. 4, according to an embodiment.
Figure 5B:
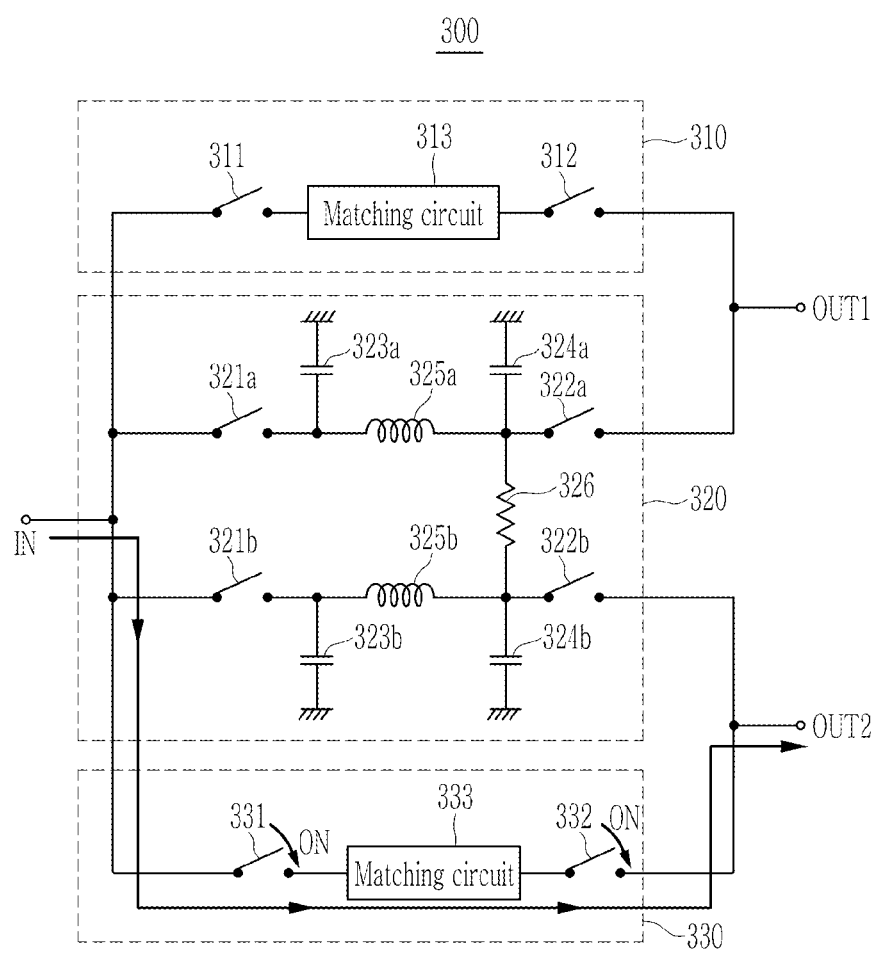
Figure 5C:
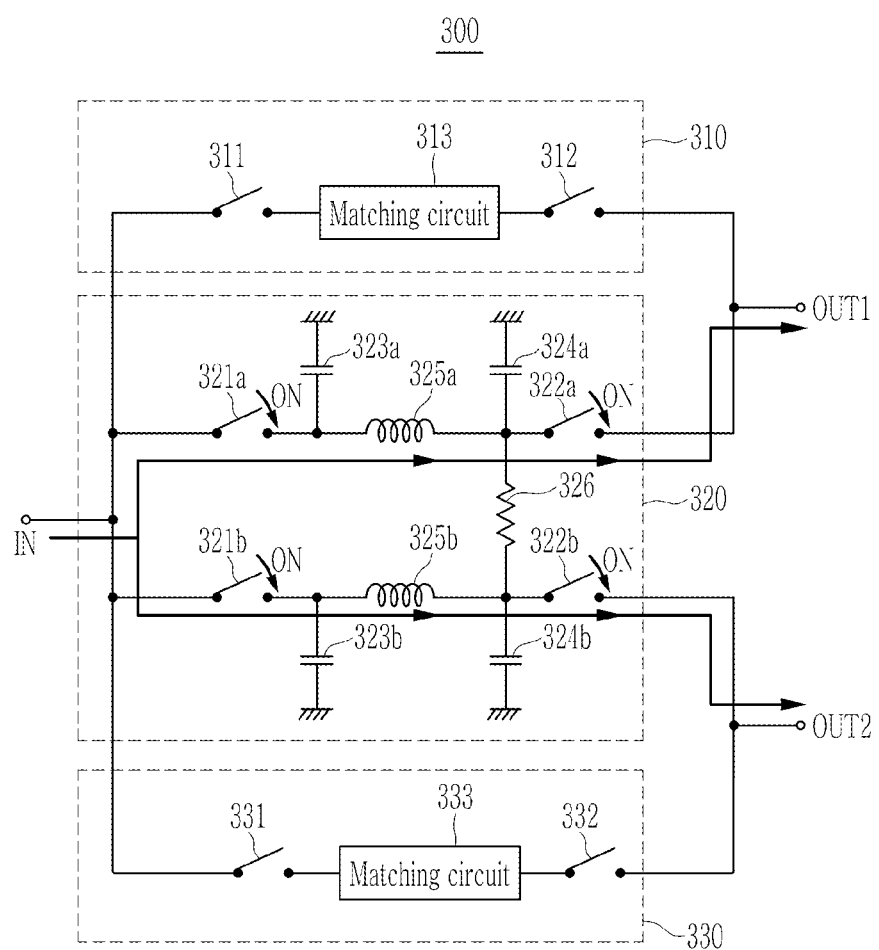

FIG. 5A to FIG. 5C respectively illustrate an operating method of the splitter circuit 300 of FIG. 4, according to an embodiment.

FIG. 5A is a drawing showing an operation of the splitter circuit 300 in the first receiving mode. In the first receiving mode, the switch 311 and the switch 312 are turned on. Accordingly, the received RF signal input to the input terminal IN is transmitted to the first output terminal OUT1 through the switch 311, the matching circuit 313, and the switch 312. That is, the first bypass circuit 310 allows the RF signal received in the first receiving mode to bypass the signal divider 320 to be transmitted to the first output terminal OUT1. The received RF signal transmitted to the first output terminal OUT1 is output to the transmitting/receiving port TRX1 through the switch 400.

FIG. 5B is a drawing showing an operation of the splitter circuit 300 in the second receiving mode. In the second receiving mode, the switch 331 and the switch 332 are turned on. Accordingly, the received RF signal input to the input terminal IN is transmitted to the second output terminal OUT2 through the switch 331, the matching circuit 333, and the switch 332. That is, the second bypass circuit 330 allows the RF signal received in the second receiving mode to bypass the signal divider 320 to be transmitted to the second output terminal OUT2. The received RF signal transmitted to the second output terminal OUT2 is output to the receiving port RX2.

FIG. 5C is a drawing showing an operation of the splitter circuit 300 in the third receiving mode. In the third receiving mode, the switches 321a and 322a and the switches 321b and 322b are turned on. Accordingly, the received RF signal input to the input terminal IN is split into a first split signal and a second split signal. The first split signal is transmitted to the first output terminal OUT1 through the switch 321a, the inductor 325a, and the switch 322a. In addition, the second split signal is transmitted to the second output terminal OUT2 through the switch 321b, the inductor 325b, and the switch 322b. That is, the signal divider 320 splits the RF signal received in the third receiving mode into the first split signal and the second split signal, and outputs the first split signal and the second split signal to the first output terminal OUT1 and the second output terminal OUT2, respectively. The first split signal output to the first output terminal OUT1 is output to the transmitting/receiving port TRX1 through the switch 400. In addition, the second split signal output to the second output terminal OUT2 is output to the receiving port RX2.

Figure 6:
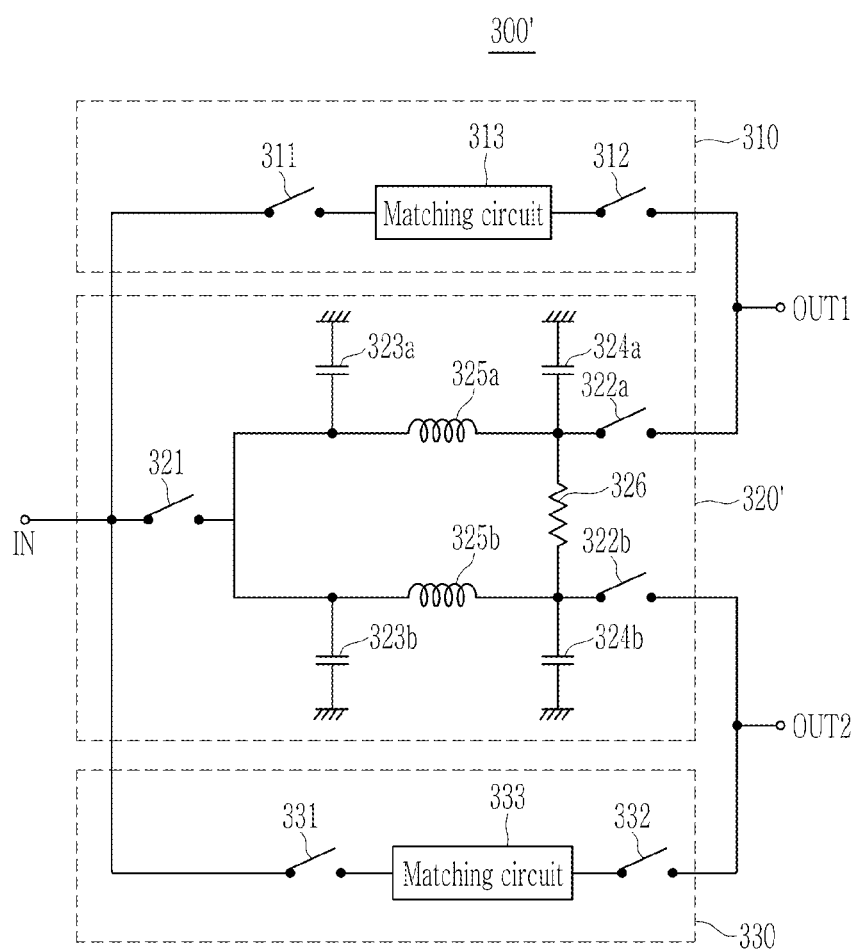
FIG. 6 illustrates a configuration of a splitter circuit, according to an embodiment.

Referring to FIG. 5C, since the switch 321a and the switch 321b are simultaneously turned on in the third receiving mode, the switches 321a and 321b may be replaced by one switch. FIG. 6 illustrates the above-mentioned case.

FIG. 6 illustrates a configuration of a splitter circuit 300', according to an embodiment.

As shown in FIG. 6, the splitter circuit 300' is the same as' the splitter circuit 300 of FIG. 4, except that the switches 321a and 321b of FIG. 4 are replaced with one switch 321. One terminal of the switch 321 is connected to the input terminal IN, and the other terminal of the switch 321 is connected to one terminal of the capacitor 323a and one terminal of the capacitor 323b. In the third receiving mode, the switch 321 is turned on, and the received RF signal input to the input terminal IN is split into a first split signal and a second split signal. The first split signal is transmitted to the first output terminal OUT1 through the switch 321, the inductor 325a, and the switch 322a. In addition, the second split signal is transmitted to the second output terminal OUT2 through the switch 321, the inductor 325b, and the switch 322b.

Figure 7:
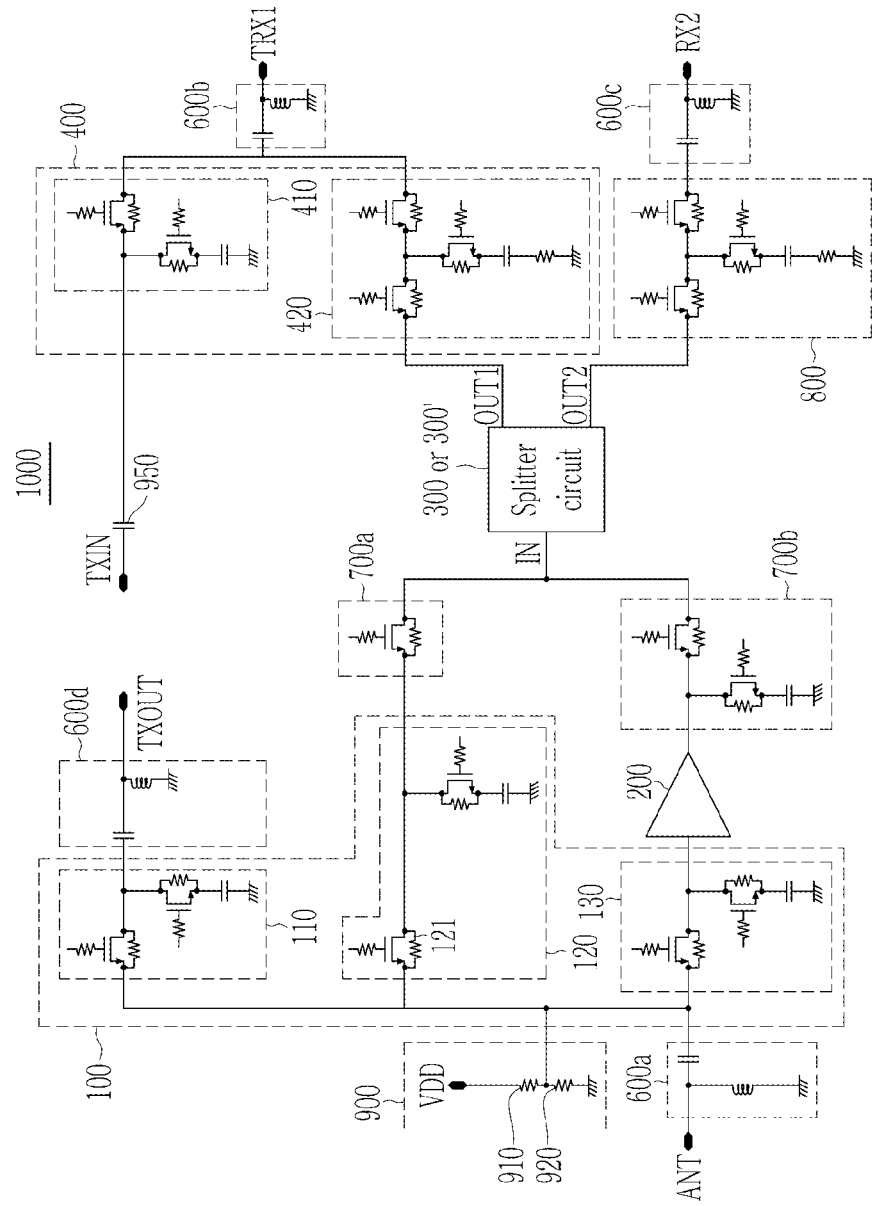
FIG. 7 illustrates a circuit diagram of a front end module, according to an embodiment.

FIG. 7 illustrates a circuit diagram of the front end module 1000, according to an embodiment. That is, FIG. 7 illustrates a more detailed internal configuration circuit diagram of the front end module 1000.

Referring to FIG. 7, the first switch 100 may include three switches 110, 120, and 130. The three switches 110, 120, and 130 may have an SP3T structure. Each of the switches 110, 120, and 130 may include a series transistor and a shunt transistor that alternately switch each other. In the following description, a predetermined switch being turned on may mean that the series transistor is turned on and the shunt transistor is turned off, and that a predetermined switch being turned off may mean that the series transistor is turned off and the shunt transistor is turned on. The switch 110 is positioned between the antenna port ANT and the transmitting output port TXOUT, and switches the transmitted RF signal input from the transmitting output port TXOUT in the transmitting mode to the antenna port ANT. The switch 120 is positioned between the antenna port ANT and the input terminal IN of the splitter circuit 300, and allows the received RF signal to bypass the amplifier 200 in the receiving mode. That is, the switch 120 is turned on when the received RF signal has a large amplitude, and the received RF signal is bypassed without being amplified. The switch 130 is positioned between the antenna port ANT and the amplifier 200, and transmits the received RF signal to the amplifier 200. In other words, the switch 130 is turned on when the received RF signal has a small amplitude, and the received RF signal is amplified by the amplifier 200.

The splitter circuit 300 or 300' shown in FIG. 7 may be the splitter circuit shown in FIG. 4 or FIG. 6 above.

The switch 400 may include two switches 410 and 420. The two switches 410 and 420 may have an SPDT structure. Each of the switches 410 and 420 may include a series transistor and a shunt transistor that alternately switch each other. Meanwhile, in FIG. 7, the switch 420 is shown to include two series transistors and one shunt transistor, but may include one series transistor and one shunt transistor. The switch 410 is positioned between the transmitting/receiving port TRX1 and the transmitting input port TXIN, and switches the transmitted RF signal input from the transmitting/receiving port TRX1 to the transmitting input port TXIN in the transmitting mode. The switch 420 is positioned between the first output terminal OUT1 of the splitter circuit 300 and the transmitting/receiving port TRX1, and switches the received RF signal output from the first output terminal OUT1 of the splitter circuit 300 to the transmitting/receiving port TRX1 in the receiving mode.

The front end module 1000 may further include a bias circuit 900. The bias circuit 900 may include a resistor 910 and a resistor 920. A power source voltage VDD is divided by the resistors 910 and 920, and the divided voltage (that is, the bias voltage) is provided to the transistors of the switch 100 (for example, series transistors). When the divided voltage (bias voltage) is applied to the transistors of the switch 100, a turn-off operation of the transistors may be more smoothly performed. For example, when a 0 V voltage is applied to gates of transistors, the transistors may be more effectively turned off.

The front end module 1000 may further include a plurality of matching circuits 600a, 600b, 600c, and 600d for performing impedance matching. The matching circuit 600a is connected to the antenna port ANT to perform impedance matching, and the matching circuit 600b is connected to the transmitting/receiving port TRX1 to perform impedance matching. In addition, the matching circuit 600c is connected to the receiving port RX2 to perform impedance matching, and the matching circuit 600d is connected to the transmitting output port TXOUT to perform impedance matching. Each of the matching circuits 600a, 600b, 600c, and 600d may include an inductor and a capacitor. Meanwhile, the front end module 1000 may further include a coupling capacitor 950 connected to the transmitting input port TXIN.

The front end module 1000 may further include a switch 700a and a switch 700b, which are isolation switches. The switch 700a is positioned between the switch 120 and the input terminal IN of the splitter circuit 300 or 300', and may prevent an output signal of the amplifier 200 from being introduced to the switch 120. The switch 700a is turned on when the switch 120 is turned on (that is, when the series transistor is turned on). In addition, the switch 700b is positioned between the output terminal of the amplifier 200 and the input terminal IN of the splitter circuit 300 or 300', and it may prevent the received RF signal passing through the switch 120 from being introduced to the amplifier 200. The switch 700b is turned on when the switch 130 is turned on (that is, when the series transistor is turned on). Meanwhile, the switch 700a may include one series transistor, and the switch 700b may include a series transistor and a shunt transistor.

In addition, the front end module 1000 may further include a switch 800. The switch 800 is positioned between the second output terminal OUT2 of the splitter circuit 300 or 300' and the receiving port RX2. The switch 800 is turned on in the second receiving mode, and transmits the received RF signal (that is, a second split signal) output from the second output terminal of the splitter circuit 300 or 300' to the receiving port RX2. Meanwhile, in FIG. 7, the switch 800 is shown to include two series transistors and one shunt transistor, but may include one series transistor and one shunt transistor.

The variable resistor R of FIG. 1 may be implemented with a series transistor 121 and a transistor 700a of the switch 121 of FIG. 7. When the series transistor 121 and transistor 700a are turned on, turn-on resistance of the two transistors 121 and 700a occurs, and the turn-on resistance may serve as the variable resistor R of FIG. 1.

Each of the transistors configuring the switches of FIG. 7 may be a field effect transistor (FET), a metal oxide semiconductor field effect transistor (MOSFET), a bipolar junction transistor (BJT), or the like.

Figure 8:
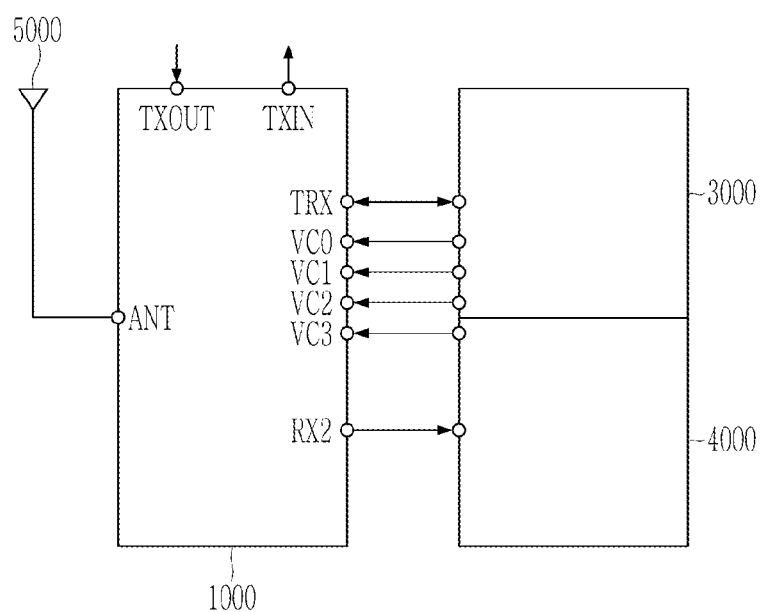
FIG. 8 illustrates a peripheral structure of a front end module, according to an embodiment.

FIG. 8 illustrates a peripheral structure of the front end module 1000, according to an embodiment.

Referring to FIG. 8, the front end module 1000 may be electrically connected to an antenna 5000 through the antenna port ANT. The front end module 1000 may be connected to a first communication chipset 3000 through the transmitting/receiving port TRX1, and may be electrically connected to a second communication chipset 4000 through the receiving port RX2. The front end module 1000 may be electrically connected to a power amplifier through the transmitting input port TXIN and the transmitting output port TXOUT, and may receive mode control voltages VC0, VC1, VC2, and VC3 from the first and second communication chipsets 3000 and 4000.

The front end module 1000, the first communication chipset 3000, the second communication chipset 4000, and the antenna 5000 may be disposed in an electronic device. The electronic device may be a smart phone, a personal digital assistant, a digital video camera, a digital still camera, a network system, a computer, a monitor, a tablet, a laptop computer, a netbook computer, a television, a video game device, a smart watch, or an automotive part, but is not limited thereto.

The controller 500 in FIGS. 1-8 that performs the operations described in this application is implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS

1000: front end module
2000: power amplifier
100: switch
200: amplifier
300: splitter circuit
400: switch
500: controller
310: first bypass circuit
320: signal divider
330: second bypass circuit
3000: first communication chipset
4000: second communication chipset

What is claimed is:

1. A splitter circuit, comprising:
a signal divider configured to split and transmit a first radio frequency (RF) signal received in a first receiving mode in which a first communication scheme and a second communication scheme are simultaneously performed;
a first bypass circuit configured to bypass the signal divider to transmit a second RF signal received in a second receiving mode in which the first communication scheme is performed; and
a second bypass circuit configured to bypass the signal divider to transmit a third RF signal received in a third receiving mode in which the second communication scheme is performed.

2. The splitter circuit of claim 1, wherein the first bypass circuit includes a first switch configured to be turned on in the second receiving mode, and
wherein the second bypass circuit includes a second switch configured to be turned on in the third receiving mode.

3. The splitter circuit of claim 2, wherein the signal divider includes a third switch configured to be turned on in the first receiving mode.

4. The splitter circuit of claim 2, wherein the first switch is connected to an input terminal to which the second RF signal is input,
wherein the first bypass circuit further includes a third switch connected to an output terminal of the first bypass circuit and configured to be turned on in the second receiving mode,
wherein the second switch is connected to the input terminal, and
wherein the second bypass circuit further includes a fourth switch connected to an output terminal of the second bypass circuit and configured to be turned on in the third receiving mode.

5. The splitter circuit of claim 4, wherein the first bypass circuit is connected between the first switch and the third switch, and further includes a matching circuit configured to perform impedance matching, and
wherein the second bypass circuit is connected between the second switch and the fourth switch, and further includes another matching circuit configured to perform impedance matching.

6. The splitter circuit of claim 3, wherein the signal divider is configured to split the first RF signal into a first spilt signal and a second split signal in the first receiving mode, output the first split signal to a first output terminal, and output the second split signal to a second output terminal,
wherein the third switch is connected to an input terminal to which the first RF signal is input, and
wherein the signal divider further includes a fourth switch connected to the first output terminal and configured to be turned on in the first receiving mode, and a fifth switch connected to the second output terminal and configured to be turned on in the first receiving mode.

7. The splitter circuit of claim 6, wherein the signal divider further includes a first impedance element connected between the third switch and the fourth switch, and a second impedance element connected between the fourth switch and the fifth switch.

8. The splitter circuit of claim 6, wherein the third switch includes a sixth switch that is connected to the input terminal and is turned on in the first receiving mode, and a seventh switch that is connected to the input terminal and is turned on in the first receiving mode.

9. The splitter circuit of claim 1, wherein the splitter circuit includes an input terminal to which the first, second, and third RF signals are input, a first output terminal, and a second output terminal,
wherein the signal divider is configured to split the first RF signal into a first spilt signal and a second split signal, output the first split signal to the first output terminal, and output the second split signal to the second output terminal,
wherein the first bypass circuit is configured to transmit the second RF signal to the first output terminal, and
wherein the second bypass circuit is configured to transmit the third RF signal to the second output terminal.

10. The splitter circuit of claim 9, wherein a signal output from the first output terminal is transmitted to a first communication chipset configured to perform the first communication scheme, and
wherein a signal output from the second output terminal is transmitted to a second communication chipset configured to perform the second communication scheme.

11. A front end module, comprising:
a first switch configured to switch a received radio frequency (RF) signal input from an antenna;
an amplifier configured to amplify the received RF signal; and
a splitter circuit configured to split and transmit a first signal output from the amplifier,
wherein the splitter circuit includes:
a first bypass circuit configured to not split the first signal in a first receiving mode in which a first communication scheme is performed and transmit the first signal to a first output terminal; and
a second bypass circuit configured to not split the first signal in a second receiving mode in which a second communication scheme is performed and transmit the first signal to a second output terminal.

12. The front end module of claim 11, wherein the splitter circuit further includes a signal divider configured to, in a third receiving mode in which the first communication scheme and the second communication scheme are simultaneously performed, split the first signal into a first split signal and a second split signal, output the first split signal to the first output terminal, and output the second split signal to the second output terminal.

13. The front end module of claim 12, wherein the first bypass circuit includes a second switch configured to be turned on in the first receiving mode,
wherein the second bypass circuit includes a third switch configured to be turned on in the second receiving mode, and
wherein the splitter circuit further includes a fourth switch configured to be turned on in the third receiving mode.

14. The front end module of claim 13, wherein the second, third, and fourth switches are connected to an input terminal to which the first signal is input,
wherein the first bypass circuit further includes a fifth switch connected between the second switch and the first output terminal,
wherein the second bypass circuit further includes a sixth switch connected between the third switch and the second output terminal, and
wherein the splitter circuit further includes a seventh switch connected between the fourth switch and the first output terminal, and an eighth switch connected between the fourth switch and the second output terminal.

15. The front end module of claim 14, wherein the first bypass circuit further includes a matching circuit connected between the second switch and the fifth switch, and
wherein the second bypass circuit further includes a matching circuit connected between the third switch and the sixth switch.

16. The front end module of claim 12, wherein a signal output from the first output terminal is transmitted to a first communication chipset configured to perform the first communication scheme, and
wherein a signal output from the second output terminal is transmitted to a second communication chipset configured to perform the second communication scheme.

17. The front end module of claim 11, wherein the first switch, the amplifier, and the splitter circuit are included in one IC.

18. An operating method of a splitter circuit configured to split a received RF signal, the operating method comprising:
splitting the received RF signal into a first split signal and a second split signal in a first receiving mode in which a first communication scheme and a second communication scheme are simultaneously performed;
providing a first path that does not split the received RF signal in a second receiving mode in which only the first communication scheme is performed and bypasses the received RF signal; and
providing a second path that does not split the received RF signal in a third receiving mode in which only the second communication scheme is performed and bypasses the received RF signal.

19. The operating method of claim 18, wherein the first path includes a first switch that is turned on in the second receiving mode, and
wherein the second path includes a second switch that is turned on in the third receiving mode.

20. The operating method of claim 19, wherein the first split signal is transmitted to a first communication chipset that performs the first communication scheme,
wherein the second split signal is transmitted to a second communication chipset that performs the second communication scheme,
wherein a signal output through the first path is transmitted to the first communication chipset, and
wherein a signal output through the second path is transmitted to the second communication chipset.

* * * * *